United States Patent
Biletska et al.

(10) Patent No.: US 10,310,020 B2
(45) Date of Patent: Jun. 4, 2019

(54) METHOD, DEVICE AND SYSTEM FOR ESTIMATING THE CHARGE STATE OF A BATTERY

(71) Applicant: COMMISSARIAT A L'ENERGIE ATOMIQUE ET AUX ENERGIES ALTERNATIVES, Paris (FR)

(72) Inventors: Krystyna Biletska, Orsay (FR); Frédéric Suard, Versailles (FR); Maxime Montaru, Joursac (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 139 days.

(21) Appl. No.: 14/912,582

(22) PCT Filed: Sep. 10, 2014

(86) PCT No.: PCT/EP2014/069327
§ 371 (c)(1),
(2) Date: Feb. 17, 2016

(87) PCT Pub. No.: WO2015/036453
PCT Pub. Date: Mar. 19, 2015

(65) Prior Publication Data
US 2016/0202324 A1    Jul. 14, 2016

(30) Foreign Application Priority Data
Sep. 11, 2013 (FR) ..................................... 13 58743

(51) Int. Cl.
*G01R 31/3842* (2019.01)
*G01R 31/367* (2019.01)
(Continued)

(52) U.S. Cl.
CPC ............ *G01R 31/367* (2019.01); *B60L 3/12* (2013.01); *B60L 11/1861* (2013.01);
(Continued)

(58) Field of Classification Search
CPC ............ G01R 31/3651; G01R 31/3662; G01R 31/3634; G01R 31/3624; B60L 3/12;
(Continued)

(56) References Cited

U.S. PATENT DOCUMENTS

| 4,677,363 A | 6/1987 | Kopmann |
| 6,411,911 B1 | 6/2002 | Hirsch et al. |

(Continued)

FOREIGN PATENT DOCUMENTS

| DE | 199 60 761 C1 | 5/2001 |
| DE | 103 28 721 A1 | 1/2005 |

OTHER PUBLICATIONS

T. Hansen et al., "Support vector based state of charge estimator," Journal of Power Sources, vol. 141 (2005), pp. 351-358.

(Continued)

*Primary Examiner* — Khamdan N. Alrobaie
(74) *Attorney, Agent, or Firm* — Baker & Hostetler LLP (57) ABSTRACT

A method for estimating the charge of a battery comprises: acquiring at least one time series of measurements of voltage across the terminals of the battery, and at least one other time series of measurements of another physical parameter of the battery or of its environment; determining an operating regime of the battery; choosing a regression model from among a predefined set of such models; and estimating the charge of the battery by applying the regression model to the time series of voltage measurements and to at least one other time series of measurements. A device for estimating the charge of a battery and a device for training regression models of the charge of a battery, adapted for the implementation of the method are provided. A system for estimating the charge of a battery comprising a device for estimating the charge and a device for training regression models is provided.

15 Claims, 7 Drawing Sheets

(51) Int. Cl.
*G01R 31/387* (2019.01)
*G01R 31/389* (2019.01)
*B60L 3/12* (2006.01)
*B60L 11/18* (2006.01)

(52) U.S. Cl.
CPC ......... *G01R 31/387* (2019.01); *G01R 31/389* (2019.01); *B60L 2240/547* (2013.01); *B60L 2240/549* (2013.01); *G01R 31/3842* (2019.01); *Y02T 10/7005* (2013.01); *Y02T 10/705* (2013.01); *Y02T 10/7044* (2013.01)

(58) Field of Classification Search
CPC ............ B60L 11/1861; B60L 2240/549; B60L 2240/547; Y02T 10/705; Y02T 10/7044; Y02T 10/7005
See application file for complete search history.

(56) References Cited

U.S. PATENT DOCUMENTS

| | | | | |
|---|---|---|---|---|
| 6,534,954 | B1* | 3/2003 | Plett | G01R 31/3651 320/132 |
| 7,197,487 | B2 | 3/2007 | Hansen et al. | |
| 8,269,502 | B2 | 9/2012 | Desprez et al. | |
| 9,625,533 | B2* | 4/2017 | Le | G01R 31/3651 |
| 2002/0130637 | A1* | 9/2002 | Schoch | G01R 31/3651 320/132 |
| 2003/0008202 | A1* | 1/2003 | Tran | G01R 31/361 429/61 |
| 2003/0030442 | A1 | 2/2003 | Sugimoto | |
| 2005/0088145 | A1 | 4/2005 | Loch | |
| 2006/0250137 | A1 | 11/2006 | Frey et al. | |
| 2010/0090651 | A1 | 4/2010 | Sahu et al. | |
| 2010/0324848 | A1 | 12/2010 | Cho et al. | |
| 2011/0316547 | A1* | 12/2011 | Liu | G01R 31/362 324/427 |
| 2013/0013235 | A1 | 1/2013 | Takahashi | |
| 2014/0320144 | A1* | 10/2014 | Nakaya | H01M 10/54 324/434 |
| 2015/0046108 | A1* | 2/2015 | Akamine | H01M 10/48 702/63 |
| 2016/0041231 | A1* | 2/2016 | Lee | G01R 31/3679 702/63 |

OTHER PUBLICATIONS

E. Keogh et al., "An Online algorithm for Segmenting Time Series," Proceeding of the IEEE International Conference on Data Mining ICDM 2001, pp. 289-296.

K. S. Ng et al., "Enhanced coulomb counting method for estimating state-of-charge and state-of-health of lithium-ion batteries," Applied Energy, vol. 86 (2009), pp. 1506-1511.

S. Piller et al., "Methods for state-of-charge determination and their applications," Journal of Power Sources, vol. 96 (2001), pp. 113-120.

M. Tipping, "Sparse Bayesian Learning and the Relevance Vector Machine," Journal of Machine Learning Research 1 (2001), pp. 211-244.

* cited by examiner

METHOD, DEVICE AND SYSTEM FOR ESTIMATING THE CHARGE STATE OF A BATTERY

CROSS-REFERENCE TO RELATED APPLICATIONS

This application is a National Stage of International patent application PCT/EP2014/069327, filed on Sep. 10, 2014, which claims priority to foreign French patent application No. FR 1358743, filed on Sep. 11, 2013, the disclosures of which are incorporated by reference in their entirety.

FIELD OF THE INVENTION

The invention pertains to a method, to a device and to a system for estimating the state of charge of a battery, and in particular (but not exclusively) of a battery of an electric or hybrid vehicle. The invention also pertains to a device for estimating regression models cooperating with such a device for estimating the state of charge of a battery within the framework of such a system.

BACKGROUND

The amount of the charge stored in a battery is generally characterized by its state of charge, usually indicated by the initials SoC, which is defined as the ratio of the available capacity to the maximum possible capacity of the battery.

The knowledge of the SoC in a battery at a given moment is paramount for all systems which are powered by a battery, since their remaining autonomous operating time depends thereon. Unfortunately, it is impossible to measure the SoC directly. It is possible to use certain measurable physical quantities for which a relationship with the SoC is established. But the measurement of such quantities is governed by numerous constraints related to the environment of the battery and to the conditions of its use. For example, it is possible to use the no-load voltage; however, the conditions of measurement of this voltage remain limited to the periods during which the battery is not used. It is also possible to use the impedance of the battery; however, this quantity is greatly influenced by the experimental conditions such as the temperature and the current. Therefore, the state of charge of a battery can only be estimated during use with the aid of an appropriate model.

This estimation is substantially complicated by the fact that the state of charge of a battery depends on a multitude of parameters: the conditions of its use, that is to say its charge regime or discharge regime, the external temperature, on the intrinsic characteristics of the battery, etc. The calculation of the SoC does indeed depend on the maximum capacity $C_{max}$ of the battery, which may be considerably reduced if the external temperature is low. For example, the maximum capacity at a given instant may correspond to 80% of the maximum capacity measured under the more favorable conditions. Moreover, it decreases as the battery ages and makes it possible to establish an aging criterion called state of life (SoH).

Because of the technical and economic importance of the problem, very many schemes for estimating the state of charge of a battery have been proposed. Several of these schemes are described in the article by S. Piller, M. Perrin and A. Jossen "Methods for state-of-charge determination and their applications", Journal of Power Sources 96 (2001) 113-120.

So-called "direct calculation" schemes rely on charts which match in a one-to-one manner the state of charge of a battery with another characteristic physical quantity of the battery, usually a voltage U measured across the terminals of the battery, and in particular the no-load voltage $U_0$. See for example document U.S. Pat. No. 4,677,363. Unfortunately, a relation "SoC=f(U)"—where U is the voltage measured across the terminals of the battery—is not strictly one-to-one for all types of batteries, in particular, Li-ion batteries. Other physical quantities such as the no-load voltage $U_0$, the physical properties of the electrolyte and the electrochemical impedance Z have been proposed for estimating the SoC. The relation SoC=f($U_0$), in particular, is reliable but rather inconvenient since the no-load voltage can only be measured when a battery has been in a rest state for a certain time and under specific temperature conditions. The physical properties of the electrolyte can only be measured when the latter is liquid and, consequently, they cannot be utilized for all types of electrochemical composition of the batteries. The relation SoC=f(Z) is not strictly one-to-one for all types of battery and varies greatly as a function of the temperature of the battery and of its charge/discharge regime. Furthermore, constructing charts for all the temperatures, all the aging states and all the discharge/charge regimes of a battery is a very laborious task requiring specific and expensive hardware. Moreover, these schemes do not make it possible to directly integrate the dispersion in the behaviors of the batteries of the same electrochemical composition. The inaccuracy in the measurements and the weak representation of the diversity of the behaviors of a battery afforded by charts do not make it possible to apply the technique of real-time direct calculation as is, but require calibration procedures that may entail a significant cost overhead.

Document US 2010/0090651 describes a method for estimating the state of charge of a battery comprising two steps:

firstly, a step of estimating the no-load voltage $U_0$ by linear interpolation of voltage and current measurements;

then, a step of determining the state of charge on the basis of the value thus estimated of $U_0$ by means of a chart.

To implement the first step, two different regression models are used depending on whether the battery is in a charging or discharging condition.

This method exhibits the aforementioned drawbacks of the direct calculation schemes, except in that it does not require a direct measurement of $U_0$.

The estimation of the SoC based on physical models is the most widespread. This involves models which rely on variables such as a current, a voltage, an internal temperature, a no-load voltage, an external temperature, an impedance, etc. The simplest and best known way of estimating the SoC is "coulometry", which consists in calculating the amount of charge $C_{F/E}$ provided by/extracted from a battery relative to the maximum capacity $C_{max}$ of the battery. The amount of charge $C_{F/E}$ is estimated by integrating the current I(t) during the use of the battery. The coulometric estimator of the SoC is expressed as follows:

$$SoC(t) = SoC_0 + \frac{C_{F/E}}{C_{max}} = SoC_0 + \frac{1}{C_{max}} \int_{t_0}^{t} \eta \cdot I(\tau) d\tau \quad (1)$$

where $SoC_0$ is an initial state of charge, assumed known (for example, a state of complete charge or of complete discharge), $[t_0, t]$ is a period of use of the battery and $\eta$ the Faraday efficiency (ratio of the charge which can be stored in the battery to the charge which can be extracted therefrom). See for example the article by Kong Soon Ng et al. "Enhanced coulomb counting method for estimating state-of-charge and state-of-health of lithium-ion batteries", Applied Energy 86 2009) 1506-1511.

This scheme exhibits a certain number of drawbacks:
the current sensor may be inaccurate and, as the measured current is integrated, the measurement errors build up;
the knowledge of the maximum capacity is difficult within the framework of the application and may therefore be very approximate;
the phenomenon of self-discharge is not taken into account;
the Faraday efficiency is also not well known in real time.

The coulometric model for estimating the SoC can be improved by combining it with models of other measurable physical quantities by means of data fusion techniques such as Kalman filtering. This technique requires the construction of a model of the battery in the form of an equivalent circuit which depends on the electrochemical composition of the battery, and is therefore not generic.

Yet other schemes make it possible to estimate the SoC on the basis of models of the kinetics of the chemical reactions and of the diffusion phenomenon, which are specific to each type of electrochemical composition of the battery. The main drawback of these schemes is their lack of generality.

Finally, numerous other schemes for estimating the SoC use statistical training techniques to automatically determine coefficients of a physical, semi-physical or indeed purely mathematical model (approach of the "black box" type).

The article by T. Hansen and Chia-Jiu Wang "Support vector based state of charge estimator", Journal of Power Sources 141 (2005), pages 351-358 and patent U.S. Pat. No. 7,197,487 describe a scheme for estimating the SoC on the basis of a kernel regression model with a polynomial kernel whose coefficients are estimated by the Support Vector Regression (SVR) scheme. Patent application US 2010/0324848 describes the use of a neural network—and of several mathematical techniques for estimating the coefficients of this network—to estimate the SoC of a battery on the basis of instantaneous measurements of voltage, current and temperature, and on the basis of the first and second derivatives of the voltage.

These schemes, based on statistical training, are potentially very general, since they use models which are not based on any assumption relating to the composition, the structure or the operation of the battery. Moreover these models are flexible since they can use a variable number of input variables and do not depend on the nature of the latter. However, the present inventors have realized that this great generality is difficult to achieve in practice. Indeed, the generality of a model depends in a critical manner on the quality of its training base, that is to say of the database used for the training of the coefficients of the SoC estimation model. This base must be sufficiently comprehensive without being redundant, and without its size becoming too big.

SUMMARY OF THE INVENTION

The invention is aimed at affording a method and a system for estimating the state of charge of a battery not exhibiting the aforementioned drawbacks of the prior art. Advantageously, such a method and such a system exhibit a high level of generality (that is to say that they can be applied to batteries of different types and/or under different conditions of use) and are appropriate for real-time applications by means of onboard sensors.

A subject of the invention is therefore a method for estimating the state of charge of a battery comprising the following steps:
a) acquiring at least one time series of measurements of voltage across the terminals of said battery, as well as at least one other time series of measurements of another physical parameter of said battery or of its environment;
b) determining, as a function of said measurements, an operating regime of said battery;
c) choosing, as a function of said operating regime, a non-linear regression model from among a predefined set of such models; and
d) estimating the state of charge of said battery by "direct" application of said nonlinear regression model to said time series of voltage measurements and to said or to at least one said other time series of measurements.

Said operating regime can in particular be defined by at least one parameter chosen from among: a state of charge of the battery, the fact that it is undergoing charging or discharging, a charging rate or a temperature.

More generally, said operating regime can be defined by at least one parameter chosen from among: a state of charge of the battery, the fact that it is undergoing charging or discharging, a charging or discharging rate, an ambient or internal temperature, a mean of values of said time series of voltage measurements, an impedance of the battery or a measurement of its state of health.

According to particular embodiments of such a method:
The one said or the other said physical parameters can be chosen from among: a current provided or absorbed by the battery, an internal temperature of the battery, an ambient temperature.
Said step a) can comprise at least the acquisition of a time series of measurements of voltage across the terminals of said battery and of a time series of measurements of current provided or absorbed by the battery; and said step b) can comprise the determination of said operating regime of said battery—in particular when said regime is defined by a range of states of charge—on the basis of at least one voltage value and one current value arising from said time series of measurements.
Said step b) can comprise the determination of said operating regime of said battery—in particular when said regime is defined by a range of states of charge—on the basis of a mean value of voltage across its terminals and of a mean value of current absorbed or provided by the battery by means of a correspondence table or function.
Said step c) can comprise the choosing of a model, also as a function of said or of a said other physical parameter or of an item of information regarding state of health of said battery.
The method can comprise an operation of low-pass filtering or smoothing of said or of at least one said time series of measurements prior to said step d).
Said predefined set of models can comprise a plurality of models at least one of which is chosen from among a kernel regression model, a support vector regression model and a relevance vector machine.
The method can also comprise the following steps: e) determining whether said time series of measurements correspond to conditions of use which have not been taken into account during the construction of the regression models of said set; and f) in the affirmative, storing said one or more time series of measurements in a database. A condition of use can be defined by one or more parameters of the battery or of its environment in such a way that an operating regime—used for the selection of the nonlinear regression model—corresponds to a collection of conditions of use. For example, a condition of use can be defined by one or more parameters chosen from among a mean of values of said time series of voltage measurements, the fact that the battery is undergoing charging or discharging, a charging or discharging current of the battery or an external temperature.

Said step f) can also comprise the determination of an item of information relating to a state of charge of said battery and the association of said item of information with said or with each said time series of measurements, the method also comprising an operation of excluding from said database at least one time series of measurements on the basis of a comparison between the state of charge item of information which is associated therewith and an item of information regarding state of charge of the battery determined subsequently.

The method can also comprise the following step: g) constructing the regression models of said set by training on the basis at least of a plurality of time series of measurements of voltage across the terminals of said battery and of at least one other time series of measurements of another physical parameter of said battery or of its environment, and of corresponding reference values of the state of charge of said battery.

The method can also comprise the following step: h) reconstructing by training the several said or at least one said regression model, or constructing by training a new regression model of said set, taking account of the one or more time series stored in said database during said step f).

Said step g) and/or said step h) can comprise prior operations of low-pass filtering or smoothing and of sub-sampling of said time series of measurements.

Said step g) and/or said step h) can comprise the calculation in non-real time of coulometric estimators of the charge of said battery on the basis of time series of measurements of current acquired during said step a), and the use of said coulometric estimators as reference values of the state of charge of said battery for the construction or reconstruction by training of said regression models.

Said battery can be integrated into an energy-consuming device, and said steps a) to d) or a) to f) can be implemented in real time by a state-of-charge estimation device also integrated into said energy-consuming device.

Said step g) or said steps g) and h) can be implemented in non-real time by a regression training device not integrated into said energy-consuming device.

Another subject of the invention is a device for estimating state of charge of a battery comprising: at least one voltage sensor, for measuring a voltage across the terminals of said battery; at least one other sensor, for measuring another physical parameter of said battery or of its environment; a memory for storing a set of regression models of the state of charge of said battery; and a processor programmed or configured to implement steps a) to d) or a) to f) of a method such as mentioned hereinabove by cooperating with said sensors and said memory.

Yet another subject of the invention is a device for training regression models comprising: a database storing a plurality of time series of measurements of voltage across the terminals of a battery, as well as at least one other physical parameter of said battery or of its environment; and a processor programmed or configured to implement step g) or steps g) and h) of a method such as mentioned hereinabove.

Yet another subject of the invention is a system for estimating the state of charge of a battery comprising such a state-of-charge estimation device, such a device for training regression models and a data transmission system linking said devices.

BRIEF DESCRIPTION OF THE DRAWINGS

Other characteristics, details and advantages of the invention will emerge on reading the description given with reference to the appended drawings given by way of example and which represent, respectively.

DETAILED DESCRIPTION

Figure 1:
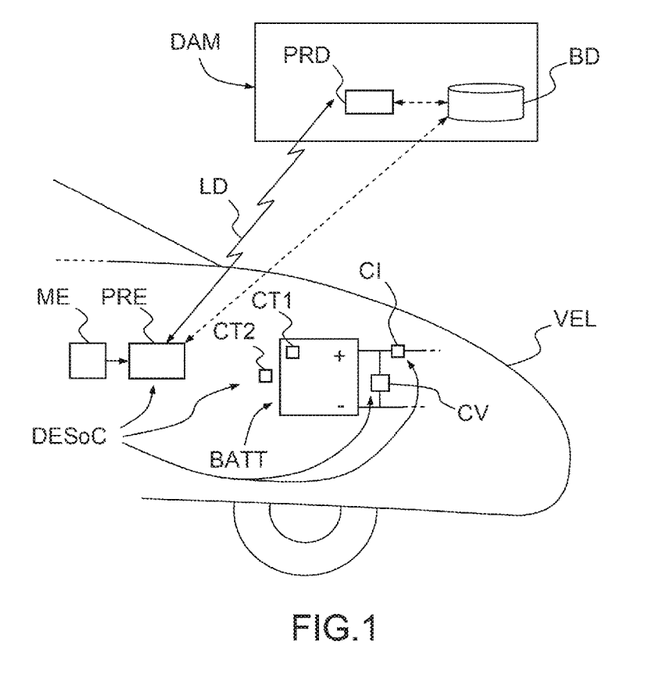
FIG. 1, a functional diagram of a system for estimating the state of charge of a battery according to an embodiment of the invention.

FIG. 1 represents an electric battery BATT on board an electric or hybrid terrestrial vehicle VEL and connected to a state-of-charge estimation device DESoC according to an embodiment of the invention. This device, also on board, comprises a processor PRE and a plurality of sensors, and in particular: a voltage sensor CV for measuring the voltage across the terminals of the battery; a current sensor CI for measuring a current provided (or absorbed) by the battery, a first temperature sensor CT1 for measuring an internal temperature of the battery and a second temperature sensor CT2 for measuring an ambient temperature outside the temperature. Other sensors may also be present, in particular other temperature sensors for measuring temperatures at various locations of the battery or of its environment. The device DESoC also comprises a memory ME in which are stored the coefficients which define several regression models of the state of charge of the battery, as well as information making it possible to define an operating regime for which each model is appropriate. The signals generated by the sensors are addressed to the processor PRE which processes them in a manner which will be described in detail further on and uses them to estimate the state of charge of the battery, with the aid of the information stored in the memory ME.

The onboard processor PRE of the device DESoC communicates, through a communication system effecting a data link LD, with a device for training models DAM, which is not on board the vehicle. The data link may be wired—thereby implying proximity between the vehicle and the device DAM or wireless, for example utilizing a telecommunications network. The communication does not have to be continuous; it may on the contrary be intermittent, short phases of data exchange being spaced apart by longer periods during which the device DESoC operates in an autonomous manner.

The device DAM comprises in its turn a processor PRD and a database BD.

As will be explained in detail further on, the database BD is fed with data to be stored by the device DESoC (which, in case of intermittent communication, had provisionally stored them in an auxiliary memory not represented in the figure); the remote processor PRD read-accesses it so as to generate state-of-charge models on the basis of the data stored therein, and then said models are communicated to the estimation device DESoC which stores them in its memory ME.

In the embodiment of FIG. 1, the database BD is colocated with the training device DAM, and the estimation device DESoC accesses it by way of the data link LD, but this is not essential.

Figure 2:
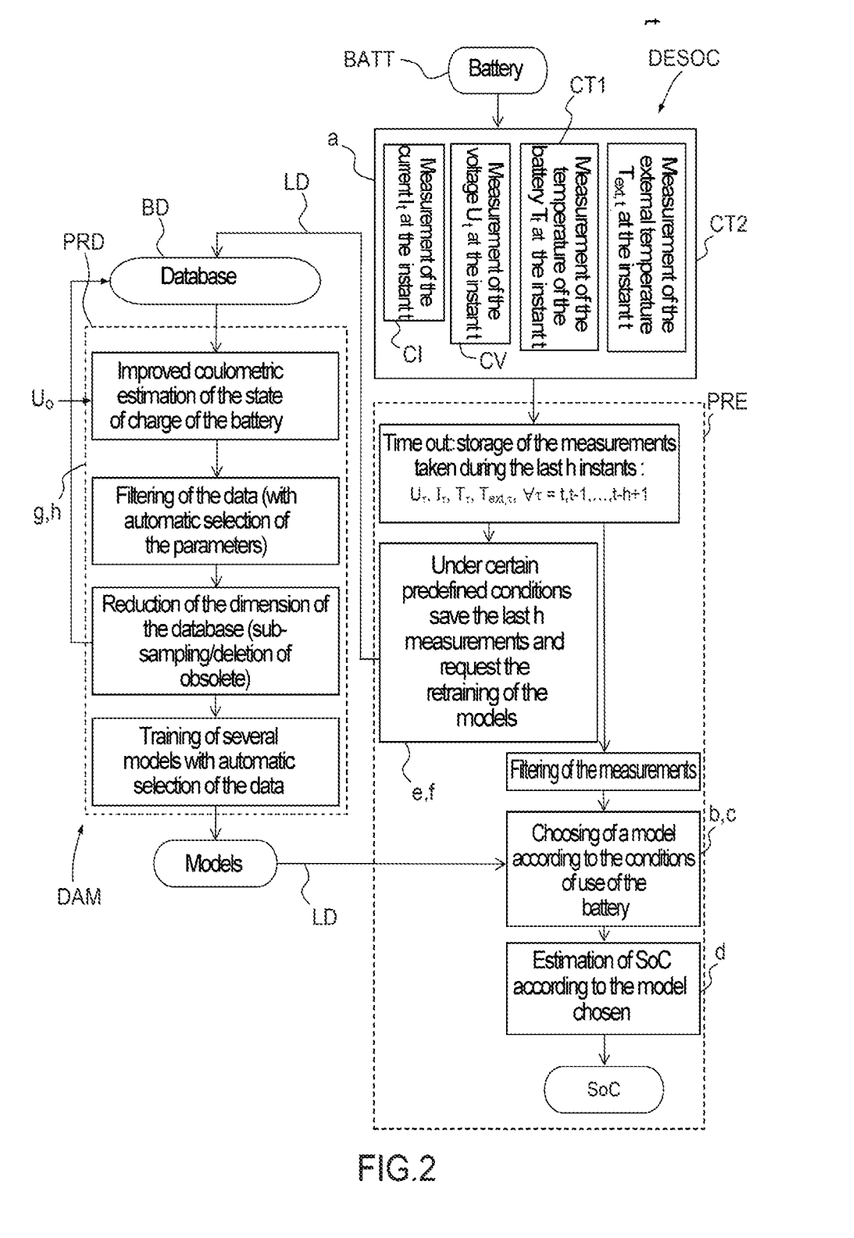
FIG. 2, a flowchart of a method for estimating the state of charge of a battery according to an embodiment of the invention.

FIG. 2 illustrates, in a general manner, a method for estimating the state of charge of a battery according to an embodiment of the invention, able to be implemented by means of the system of FIG. 1 (estimation device DESoC, training device DAM, data link LD and database BD). The various steps of this method will be described in detail further on, with the aid of FIGS. 3A to 7B.

As shown by FIG. 2, the first step (a) of the method comprises the acquisition, by the onboard sensors CI, CV, CT1 and CT2, of various time series of measurements relating to the operation of the battery: measurements of voltage $U_\tau$, current $I_\tau$, internal temperature $T_{int,\tau}$, external temperature $T_{int,\tau}$ (the index $\tau$ represents the instant of acquisition of the measurement). Not all these measurements may be necessary and other measurements may be added to the list provided by way of example. In general, at least the voltage measurements $U_\tau$ will be necessary. On the other hand, it may be advantageous not to use the current $I_\tau$ for the estimation of the state of charge since the onboard current sensors are prone to significant measurement errors. The frequency of acquisition of the measurements may be high, of the order of 10 measurements per second or greater, or lower, of the order of a measurement per second or less, as a function of the specific application considered.

The last h acquisitions of each said measurement are stored to be used for the estimation of the state of charge at the time t-h. The value of the parameter h may typically be between 1 and 50, for acquisition rates of between 0.1 Hz and 10 Hz; it may be chosen by trials.

Figure 3A:
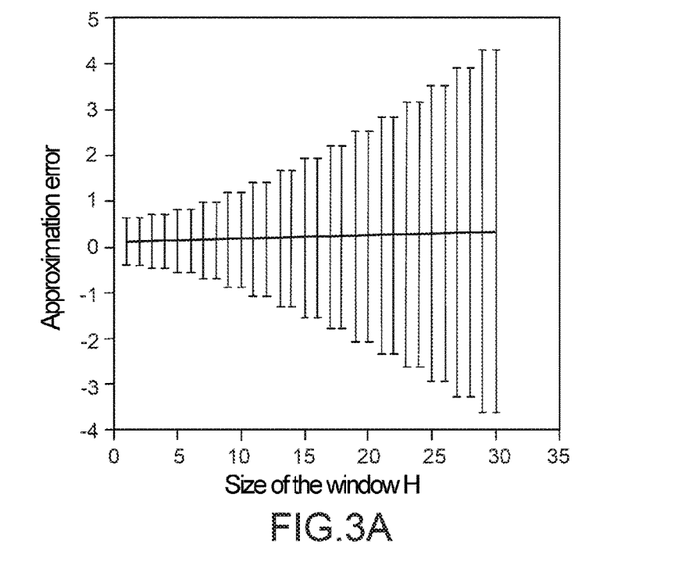
FIGS. 3A and 3B, graphics illustrating the approximation errors induced by the filtering of the data used for the estimation of the state of charge of a battery according to an embodiment of the invention.
Figure 3B:
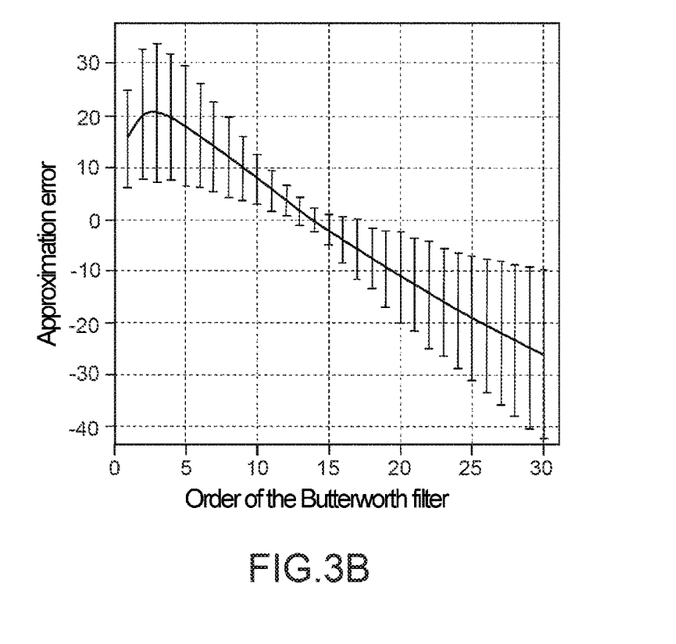

The time series of measurements are thereafter de-noised by a low-pass filter or a smoothing technique. Several filtering or smoothing techniques may be adopted. By way of example it is possible to cite the use of a median filter or of a Butterworth digital filter. The median filter consists in replacing each element $x_\tau$ of a time series by the median value of the elements contained in a sliding window of length (H+1), H being a parameter which may in particular be equal to the acquisition window "h": $x_{\tau-H/2} \ldots x_{\tau+H/2}$ (H is considered to be even). As illustrated in FIG. 3A, the larger is H, the lower is the accuracy of approximation of the initial signal. The Butterworth filter is known per se; here this entails a digital filter, expressed by a difference equation. FIG. 3B shows that there exists an optimal order for this filter (here, 14) which minimizes the approximation error.

Figure 4:
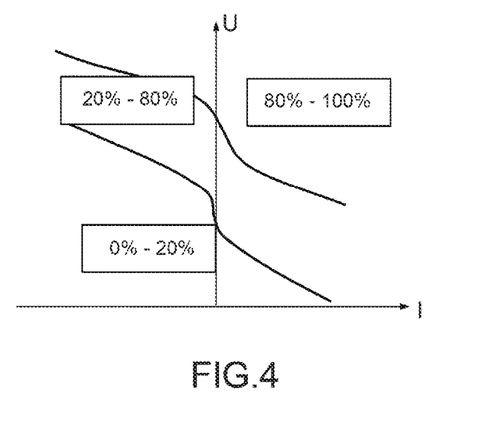
FIG. 4, a graphic illustrating in greater detail a step of determining an operating regime of the battery, determining the choice of a regression model within the framework of the method of FIG. 2.

Step (b) of the method consists in determining an operating regime of the battery, in particular characterized by a range of states of charge. For example, it is possible to identify three operating regimes: battery almost discharged—SoC is between 0% and 20%; battery partially charged—SoC is between 20% and 80%; battery charged—SoC is between 80% and 100%. The determination of the operating regime is therefore based on an approximate—or indeed coarse—estimation of the state of charge. This estimate can be obtained by "direct calculation", for example on the basis of the mean voltage and mean current during the acquisition interval. In another, less efficacious, embodiment, the estimation may be based solely on voltage measurements. It matters little that this scheme is rather inaccurate, since the aim is only to identify the operating regime. FIG. 4 illustrates a decomposition of the V-I plane into three regions corresponding to the operating regimes [0-20%], [20%-80%] and [80%-100%].

Other parameters can also be taken into account—as a supplement, or indeed in replacement for the SoC range estimated on the basis of the measured voltage—for the determination of the operating regime: the fact that the battery is undergoing charging or discharging, the charging/discharging rate, the ambient or internal temperature, a mean of values of said time series of voltage measurements, the fact that the battery is undergoing charging or discharging, a charging or discharging rate, an impedance of the battery or a measurement of its state of health. The state of health (SoH) is a measure of the performance of a battery with respect to its nominal state; it may entail for example a ratio of the capacity of the battery to its nominal capacity, when it is brand new.

During step (c), a regression model—from among those which are stored in the memory ME of the estimation device DESoC—is chosen as a function of the present operating regime of the battery. Indeed, the present inventors have realized that it is in practice difficult to create, by statistical training, a single regression model allowing reliable estimation of the state of charge of a battery. In order for a training scheme to produce an estimate of good quality the training base must be comprehensive, that is to say reflect the entire diversity of the behaviors of a battery, and consequently its size must be very significant. However, the known statistical training schemes have limits and no longer operate when the training base becomes too large. In accordance with the invention, it is therefore proposed to create a plurality of models intended to be used only for respective operating regimes. Each model is created by training on the basis of just a subset of the training database actually available. At the same time, as each model is intended to serve only for one operating regime, this reduction in the size of the training base used does not compromise the comprehensiveness thereof. This expedient makes it possible, on the one hand, to increase the amount of useful information contained in the training base and, on the other hand, to obtain a much more accurate estimation model than in the case of the techniques known from the prior art.

As will be explained further on, the training of the models is done on the basis of time series or sets of measurements stored in the database BD.

Thereafter, during step (d) of the method, the chosen model is used to estimate the state of charge SoC on the basis of the filtered measurement time series.

In a general manner, each of the models stored in the memory ME can be written in the form:

$$SoC_t = f_\lambda(x_t, w) \quad (2)$$

where $SoC_t$ is the instantaneous value, at time "t", of the state of charge that it is sought to estimate, $f_\lambda$ is a function, generally nonlinear, dependent on the vector of parameters λ, $x_t$ is a vector of "explanatory variables", that is to say of measurements (of voltage, current, internal and/or external temperature . . . ) at the instant "t"—after filtering—w a vector of regression coefficients, determined by statistical training. The models associated with the various operating regimes of the battery are distinguished by their vectors of regression coefficients, their parameters λ, or indeed by the form of their functions $f_\lambda$. "Derived" quantities such as the rate of change of the current $$\frac{dI_t}{dt},$$

the rate of change of the voltage $$\frac{dU_t}{dt}$$

and/or the electrical impedance $Z_t = U_t/I_t$ may optionally form part of the explanatory variables of the SoC estimation model.

A significant aspect of the invention is the fact that the set of regression models may be enriched and updated progressively, by retraining the existing models with the aid of the newly acquired measurements, by adding new models and/or by deleting models which are deemed outdated.

In a step (e), the onboard processor PRE determines whether the one or more time series of measurements which have just been acquired correspond to new conditions of use, which have not been recorded in the database BD and which have not therefore been taken into account during the construction of the regression models stored in the memory ME. The notion of "conditions of use" must be distinguished from that of "operating regime" which governs the choice of the model. For example, two time series characterized by similar states of charge but at different internal temperatures correspond to one and the same operating regime (and therefore to one and the same regression model) but to different conditions of use. On the other hand, a different operating regime necessarily implies different conditions of use.

Figure 5:
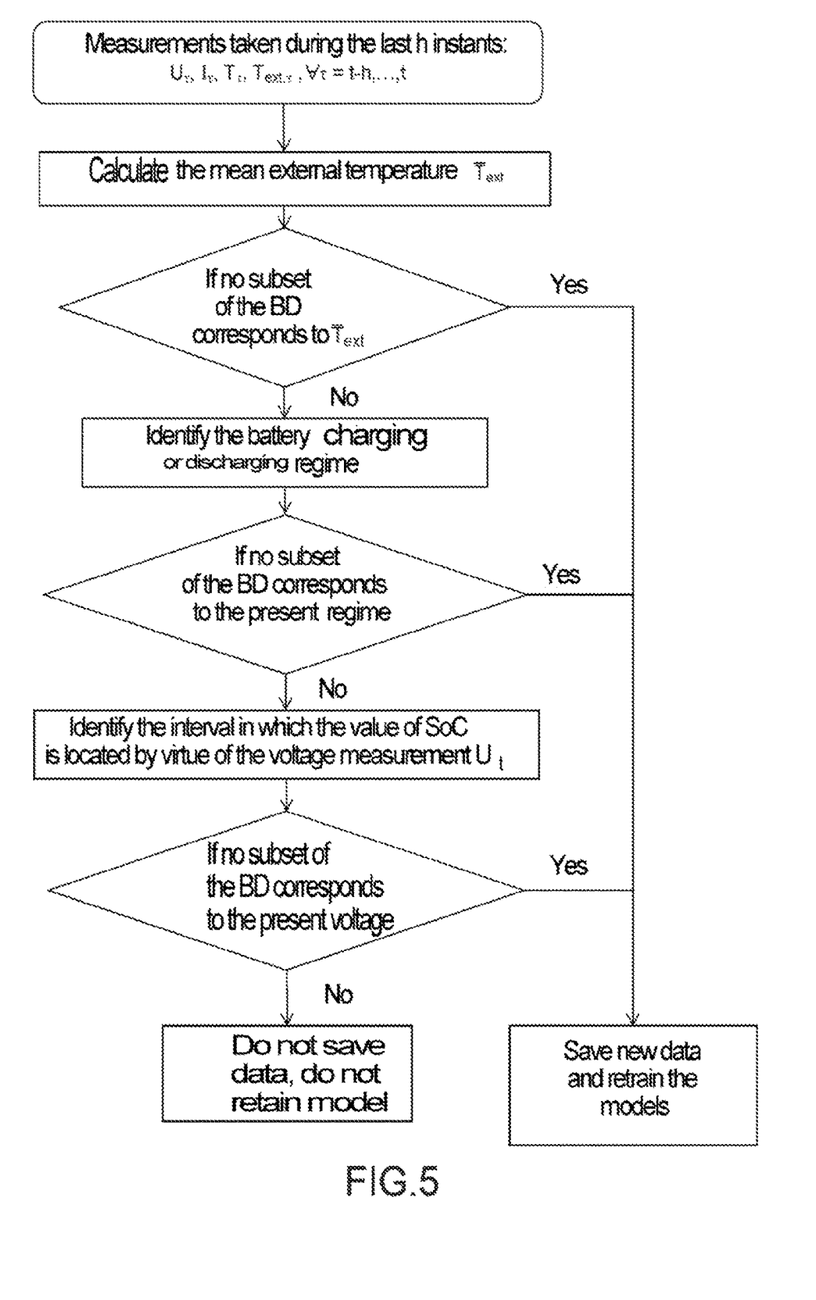
FIG. 5, a flowchart illustrating in greater detail an operation of selecting the measurements to be saved within the framework of the method of FIG. 2.

A possible embodiment of said step (e) is illustrated in greater detail in FIG. 5.

Firstly, it is verified whether the mean external temperature $T_{ext}$ measured over the acquisition window h, corresponds to a value already recorded in the database. If such is not the case, the time series of measurements which have just been acquired are considered to be "non-redundant" (corresponding to new conditions of use) and will be saved during a subsequent step (f). Otherwise, the selection process continues.

Subsequently, the charge or discharge regime of the battery is identified (that is to say that one determines whether it is undergoing charging or discharging, and at what rate, expressed by the intensity of electric current absorbed or provided by the battery). If none of the time series of measurements stored in the base—and corresponding to the mean external temperature $T_{ext}$—corresponds to such a charge/discharge regime, the time series of measurements which have just been acquired are considered to be "non-redundant"; otherwise, the selection process continues.

Thereafter, on the basis of the mean voltage, the state-of-charge interval in which the battery lies is determined, as was done during the aforementioned step (b). Once again, if none of the time series of measurements stored in the base—and corresponding to the mean external temperature $T_{ext}$, as well as to the charge/discharge regime identified previously—corresponds to such an SoC interval, the time series of measurements which have just been acquired are considered to be "non-redundant". Otherwise, they are considered to be "redundant", and so are not stored. In any event, the process stops at this juncture. Other embodiments are conceivable, taking into account other parameters defining the conditions of use.

It will be noted that the implementation of step (e) implies that the database BD does not contain solely time series of measurements, but also indications relating to the conditions of use in which they were acquired.

If, and only if, the newly acquired time series of measurements correspond to new conditions of use, they will be stored in the database—step (f)—so as to be used, jointly with the measurements which were already stored in the database, to "retrain" the regression model associated with the corresponding operating regime. The idea is that the training of each model must be done on the basis of a set of data which is as comprehensive as possible, while avoiding the redundancies which needlessly increase the training base.

Steps (a) to (f) just described are implemented by the onboard estimation device DESoC, and more particularly its processor PRE, which is programmed or configured in an opportune manner; step (f), however, also requires the intervention of the data link LD and, if appropriate, of the remote processor PRD, to store the time series of data selected in the database BD. These steps, furthermore—or at least steps (a) to (d)—are implemented in real time. On the other hand, steps (g) and (h), which will be described hereinafter, are implemented by the remote (not onboard) training device DAM, and more particularly its processor PRD, which is programmed or configured in an opportune manner, and without any real-time constraint.

Step (g) consists in creating, by statistical training, a regression model for an operating regime which was devoid thereof, on the basis of the data stored in the database BD as well as of reference measurements. Step (h) consists in retraining a regression model on the basis of the training base updated by the onboard estimation device DESoC, as was described above. The implementation of the two steps is in fact identical; the two steps differ only in that step (h) alone also uses time series of measurements newly acquired by the onboard sensors during step (f).

The statistical training of the coefficients of a regression model of the state of charge requires the knowledge of a "reference" state of charge. As explained above, the latter cannot be measured directly, but only estimated, in particular by coulometry, optionally improved by taking parameters other than the electric current into account.

$$SoC(t) = SoC_0 + \frac{1}{C_{max}} \int_{t_0}^{t} \eta \cdot I(\tau) d\tau \quad (3)$$

The initial state of charge $SoC_0$ may be known, if the battery is completely discharged ($SoC_0 = 0$) or completely charged ($SoC_0 = 100\%$), or else be determined directly on the basis of the no-load voltage $U_0$, the latter being measured by the voltage sensor CU when the battery has remained quiescent for a sufficient time. This signifies that reliable coulometric estimation of the state of charge cannot be carried out in real time. On the other hand, known "expansion" techniques allow the remote processor PRD to correct off-line (in non-real time) coulometric estimators of the SoC calculated on the basis of the measurements of current performed by the onboard sensor CI. This correction uses no-load voltage measurements. It entails considering a time series of the coulometric estimators of the SoC and which is bounded by two instants corresponding to the instants of no-load voltage measurement. These two measurements make it possible to obtain two reliable values of the SoC and to register said time series of values of the SoC by one of the existing expansion techniques (for example, cf the article "A flexible sampling-rate conversion method" by J. O. Smith and P. Gossett, IEEE 1984). This improvement of the estimation of the coulometric SoC is only possible off-line. Other techniques of improved calculation of a coulometric estimator are conceivable. The regression models are used in real time by the onboard processor PRE, but they do not use the coulometric estimation directly.

Before undertaking the training of the models, the data (time series of measurements) stored in the database are filtered or smoothed as was described above with reference to the step of real-time estimation of the state of charge. The parameters of the low-pass or smoothing filter can be determined in an automatic manner, by trials. It should be noted that the database must store—at least initially—the time series of measurements in the raw state (before filtering or smoothing) so as to allow off-line calculation of the coulometric estimators.

Before undertaking the training of the models, it is also advantageous to undertake a reduction in the volume of training data by sub-sampling. Indeed, as was mentioned above, the training algorithms do not operate well in the presence of overly significant volumes of training data.

The sub-sampling can be carried out, for example, by segmenting each time series by virtue of the sliding window algorithm (E. Keogh et al. "An Online algorithm for Segmenting Time Series", Proceeding of the IEEE International Conference on Data Mining ICDM 2001, pages 289-296) and by preserving only the end points of the segments thus identified. It is remarked that the filtering is generally a necessary preliminary to the sub-sampling, since overly noisy data cannot be effectively sub-sampled. As indicated in FIG. 2, once the coulometric estimators have been calculated, the raw data stored in the database BD can be replaced with their filtered or smoothed and sub-sampled versions.

Figure 6:
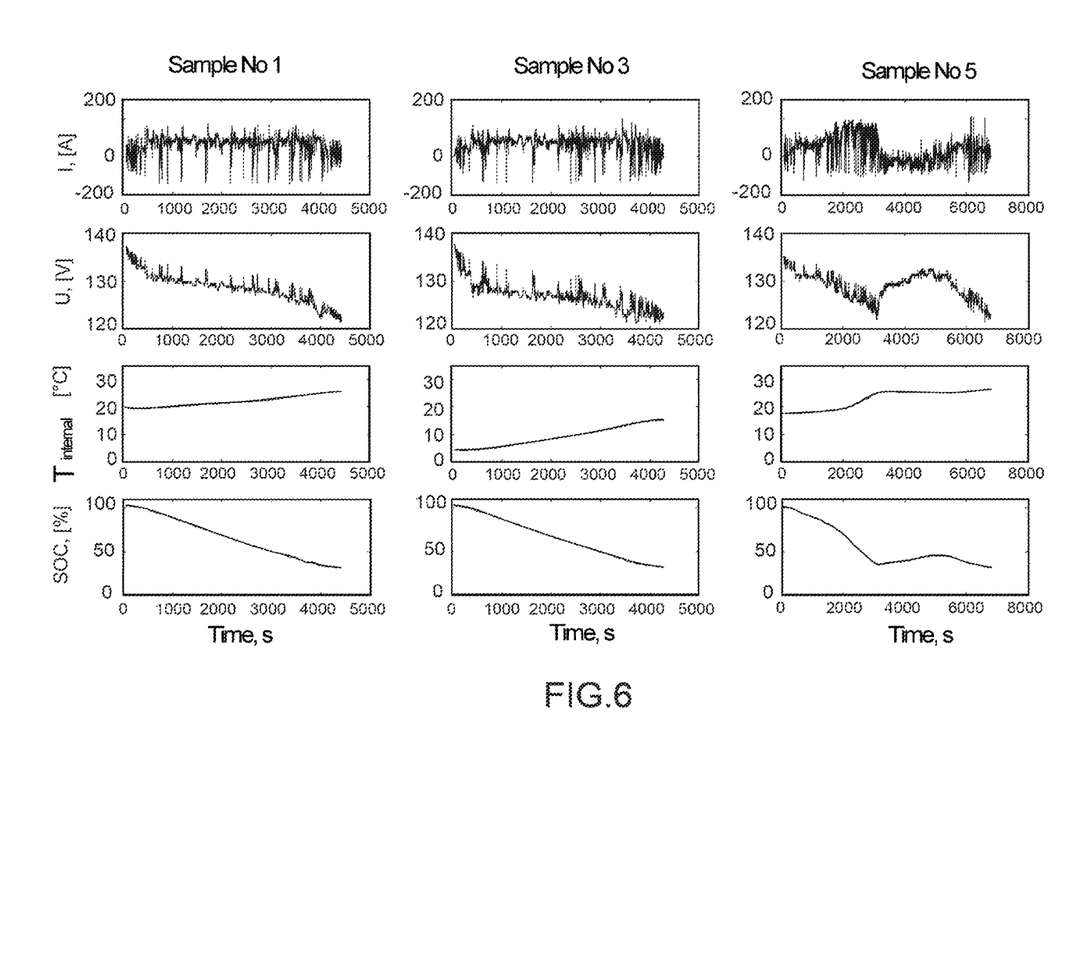
FIG. 6, graphics illustrating time series of measurements of current, voltage and internal temperature of a battery, as well as state of charge estimations for said battery, obtained on the basis of these measurements and by means of the method of FIG. 2.

To give an example, the performance of the filtering/smoothing and sub-sampling techniques, an electric vehicle has performed six runs, of a duration of between 50' and 90' approximately, during which measurements of current, voltage and internal temperature were acquired at a rate of 10 Hz (the measurements corresponding to the $1^{st}$, to the $3^{rd}$ and to the $5^{th}$ run, as well as the corresponding estimations of the SoC, are illustrated in FIG. 6). A filtering (median filter with a sliding window of h=15 samples, corresponding to 1.5 seconds) and a sub-sampling made it possible to reduce the size of each time series of measurements by about 90% (or indeed of the order of 94% for the last two runs, which were longer and therefore comprise more samples). The set of results is reproduced in the table hereinabove. It may be verified that the approximation error for the current remains very low. The approximation error is defined as being the mean absolute value of the difference between the initial signal and the filtered and sub-sampled signal (over-sampled so that its length is equal to that of the initial signal), plus or minus the standard deviation of this difference.

|  | Sample number | | | | | |
| --- | --- | --- | --- | --- | --- | --- |
|  | 1 | 2 | 3 | 4 | 5 | 6 |
| Approximation error after the filtering/sub-sampling of the signal for the current, [A] | 0.83 ± 0.64 | 0.84 ± 0.62 | 0.83 ± 0.64 | 0.83 ± 0.63 | 2.18 ± 1.53 | 2.19 ± 1.53 |
| Size of the filtered/initial sample | 2391/ 29950 | 2274/ 35606 | 2229/ 28996 | 2691/ 35913 | 2930/ 52070 | 2755/ 51538 |

A reduction in the size of the training database can also be obtained by deleting time series of measurements that have become obsolete. Accordingly, it is possible to monitor—in real time or in a discontinuous manner—the state of health of the battery (numerous techniques known from the prior art make it possible to do this, for example on the basis of measurements similar to those used for the estimation of the state of charge—see for example documents U.S. Pat. Nos. 6,411,911 and 8,269,502). The data stored in the database can then be "labeled" with an indication of corresponding state of health. In case of degradation of the state of health of the battery, the data associated with too different a state of health (difference greater than a determined threshold) to the current state of health may be considered to be obsolete and deleted.

Thereafter, the remote processor PRD undertakes the training—or the retraining—of one or more regression models on the basis of the measurements stored in the database—filtered, sub-sampled and expurgated of the obsolete data (at this juncture, the temporal structure of the measurements is no longer taken into account: the "time series" become simple sets of instantaneous measurements). Next, the coefficients characterizing said or each said model are transmitted, by way of the data link LD, to the onboard estimation device DESoC which uses them, as described previously, for the real-time estimation of the state of charge SoC of the battery.

The training or retraining of a model comprises several operations: the preselection of a training base, the normalization of the selected data, and then the training proper.

Preselection consists in choosing solely the data (measurements) associated with the operating regime (characterized, for example, by a range of values of the state of charge) of the battery for which said model should be used. On the other hand, the chosen data may correspond to different conditions of use (characterized, for example, by different temperatures and/or intensities of current).

The data selected to constitute the training base are normalized. Only the instantaneous measurements—intended to serve as explanatory variables of the regression model—are normalized, while the reference states of charge, estimated by improved coulometry (equation 3) are not. The normalization of a variable is generally performed by centering it with respect to its mean and by dividing it by its standard deviation. Here, the mean and the standard deviation of each explanatory variable are calculated over the entire training base; since the latter evolves over time, the normalization must be performed whenever the model is trained.

Figure 7A:
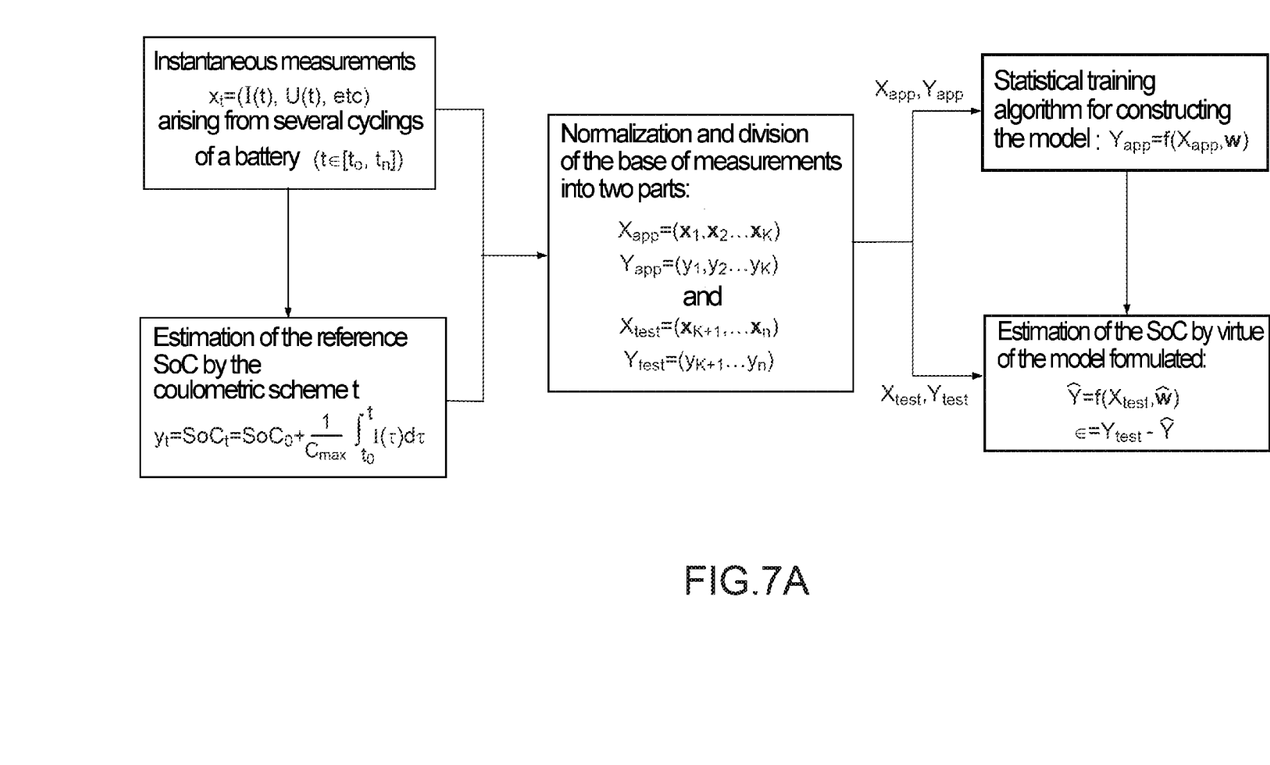
FIGS. 7A and 7B, flowcharts illustrating in greater detail an operation of constructing a regression model by statistical training with cross-validation within the framework of the method of FIG. 2.

The preselected and normalized training base thereafter serves in estimating the coefficients of the non-linear regression model (equation 2). This model contains, apart from the regression coefficients w to be estimated, parameters λ to be calibrated. According to the training scheme chosen (several of them are known) the number of these parameters to be calibrated varies. The best values of these parameters can be obtained automatically by a so-called cross-validation approach, the general principle of which is illustrated by FIG. 7A. This figure shows that a set of data selected for training and normalized is divided into two parts: a "training" subset $\{X_{app}, Y_{app}\}$ and a "test" subset $\{X_{test}, Y_{test}\}$. In each pair $\{X, Y\}$, X designates a matrix whose columns correspond to the measured quantities (current, voltage, temperature . . . ) and whose rows correspond to the instants of measurement. With each row of X is associated a reference value of the state of charge $y_t$, estimated by the improved coulometry scheme. The data $\{X_{app}, Y_{app}\}$ are thereafter divided into V parts. An algorithm of V iterations is thereafter executed. At each iteration i, {V\i} parts are used to estimate the regression coefficients w (these estimates are indicated by ŵ) and the i-th part, the so-called validation part, is used to estimate the error $\epsilon_i = T_{test} - \hat{Y}$ where $\hat{Y} = f_\lambda(X_{test}, \hat{w})$. The mean error $\bar{\epsilon} = 1/V \Sigma_{i=1}^{V} \epsilon_i$ provides an indication on the goodness of the model. This algorithm with V iterations is repeated for several values of the vector of parameters λ. The best vector λ is that which corresponds to the smallest $\bar{\epsilon}$. If V is equal to the numbers of individuals in the training base, then this type of cross-validation is called "leave-one-out". If the training set is divided into V distinct parts, then the technique is termed "V-fold". If these parts are not distinct, that is to say the same individual is in several parts at one and the same time and certain individuals do not appear in any of the parts, then one speaks of "random sub-sampling with reset".

Figure 7B:
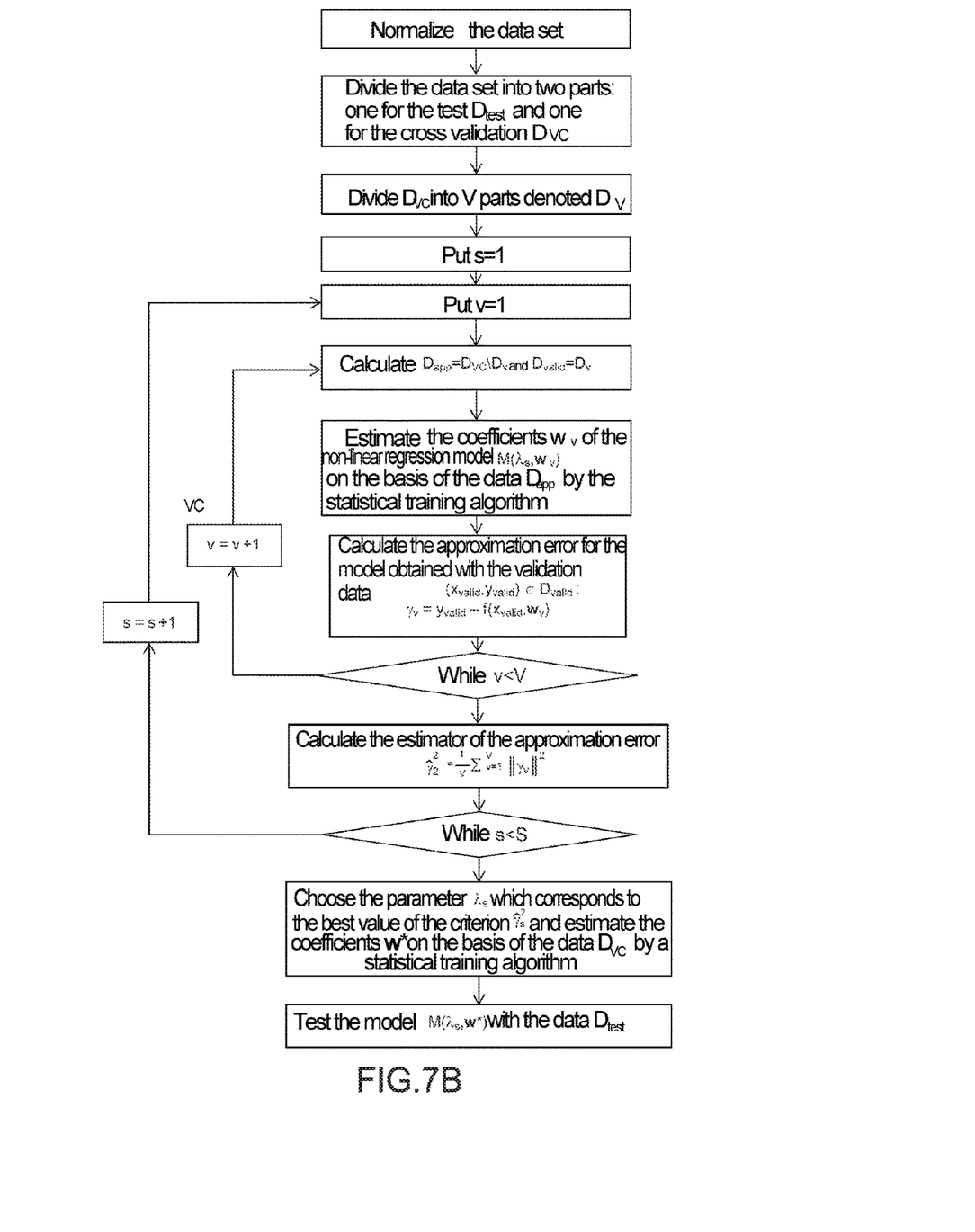

FIG. 7B illustrates an algorithm of the "V-fold" type in greater detail.

A method according to the invention can use several statistical training techniques: neural network, SVR, RVM, kernel "ridge" regression, random forests, etc. A particularly useful technique is that termed "Relevance Vector Machine" (RVM), described in the article by M. E. Tipping "Sparse Bayesian Learning and the Relevance Vector Machine" Journal of Machine Learning Research 1: 211-244 (2001).

Let $x \in \mathbb{R}^p$ be a vector composed of p measurements such as the current, the voltage, the internal temperature of the battery, the external temperature, etc, and let $\mathcal{X}_M = \{x_1, x_2, \ldots, x_M\}$ be a set of vectors representing measurements taken in the past and $\mathcal{Y}_M = \{SoC_1, SoC_2, \ldots, SoC_M\}$ a set of state-of-charge values obtained by the improved coulometric scheme. Given sets $\mathcal{X}_M$ and $\mathcal{Y}_M$, the RVM algorithm seeks to estimate the regression coefficients $w_j$ such that:

$$SoC_i = \sum_{j=1}^{M} w_0 + w_j K(x_j, x_i) + \epsilon_i, \forall i = 1, \ldots, M \quad (4)$$

where each element of the matrix K is a Gaussian kernel $$K(x, y) = e^{\frac{-\|x-y\|^2}{2\sigma^2}}$$

with the parameter σ estimated by a cross-validation scheme described hereinabove. In order for the non-linear regression model (equation 4) to be smooth and simple, so as to thus avoid overtraining and to decrease the complexity of the model, the RVM algorithm provides a regularized solution, the consequence of which is the cancellation of a certain number of regression coefficients $w_j$. The vectors $x_j$ which correspond to the non-zero regression coefficients $w_j$ are called the support vectors. The model obtained is thereafter applied in order to estimate the state of charge of the battery at the instant t:

$$SoC_t = +w_0 + \Sigma_{\forall j: q \neg w_j = 0} w_j K(x_j, x_t) \quad (5)$$

It is remarked that, in order to be able to apply equation 5 hereinabove, the regression coefficients $w_0$ and $w_j$ and also the support vectors $x_j$ must be stored in the memory ME. Stated otherwise, the support vectors $x_j$ and the regression coefficients constitute "coefficients" of the SoC estimation model.

The invention has been described with reference to a particular case in which the battery is the battery of an electric or hybrid automotive vehicle, but this does not entail an essential limitation. The invention can indeed be applied to any type of battery, for powering any type of energy-consuming apparatus or device.

The invention claimed is:

1. A method for estimating a state of charge of a battery integrated into an energy-consuming device, the method comprising:
    acquiring, by a voltage sensor integrated in a state of charge estimation device also integrated into said energy-consuming device, at least one time series of measurements of voltage across terminals of said battery;
    acquiring, by a second sensor integrated in the state of charge estimation device, at least one time series of measurements of a second physical parameter of said battery or of an environment of said battery, wherein the second physical parameter is chosen from among: a current provided or absorbed by the battery, an internal temperature of the battery, an ambient or internal temperature, a mean of values of said at least one time series of voltage measurements, a charging or discharging status of said battery, a charging or discharging rate, an impedance of the battery, and a measurement of a state of health of the battery;
    determining, by a processor integrated in the state of charge estimation device, as a function of said measurements, an operating regime of said battery;
    choosing, by said processor, as a function of said operating regime, a non-linear regression model from among a predefined set of models; and
    estimating the state of charge of said battery by applying said non-linear regression model to said time series of voltage measurements and to said at least one time series of measurements of said second physical parameter,
    wherein at least one of the steps is implemented in real-time by the state of charge estimation device.

2. The method claim 1, wherein said second physical parameter is a current provided or absorbed by the battery, and determining the operating regime is on the basis of at least one voltage value and one current value of said time series of measurements.

3. The method of claim 2, wherein determining said operating regime of said battery is on the basis of a mean value of voltage across its terminals and of a mean value of current absorbed or provided by the battery by means of a correspondence table or function.

4. The method of claim 2, wherein choosing the non-linear regression model comprises choosing a model as a function of said second physical parameter or a state of health of said battery.

5. The method of claim 1, further comprising low-pass filtering or smoothing of said at least one said time series of measurements prior to estimating the state of charge of said battery.

6. The method of claim 1, wherein said predefined set of models comprises at least one of a kernel regression model, a support vector regression model, and a relevance vector machine.

7. The method of claim 1, further comprising:
determining whether said time series of measurements correspond to one or more parameters of the battery or of its environment not taken into account during construction of the non-linear regression models of said set; and
storing said one or more time series of measurements in a database.

8. The method of claim 7, wherein storing said one or more time series of measurements comprises determining an item of information relating to a state of charge of said battery and associating said item of information with at least of said time series of measurements, the method further comprising:
excluding from said database at least one time series of measurements on the basis of a comparison between the state of charge item of information which is associated therewith and an item of information regarding state of charge of the battery determined subsequently.

9. The method of claim 1, further comprising constructing the non-linear regression models of said set by training on the basis at least of the time series of measurements of voltage across the terminals of said battery and of at least one of the series of measurements of the second parameter of said battery or of its environment, and of corresponding reference values of the state of charge of said battery.

10. The method of claim 9, further comprising:
determining whether said time series of measurements correspond to one or more parameters of the battery or of its environment not taken into account during the construction of the non-linear regression models of said set;
storing said one or more time series of measurements in a database; and
reconstructing by training the said or at least one said non-linear regression model, or constructing by training a new non-linear regression model of said set, by taking account of the one or more time series stored in said database while storing.

11. The method of claim 10, wherein constructing the non-linear models and/or reconstructing comprises low-pass filtering or smoothing and sub-sampling of said time series of measurements.

12. The method of claim 10, wherein constructing the non-linear regression models comprises calculating in non-real time coulometric estimators of the charge of said battery on the basis of a time series of measurements of current, and using said coulometric estimators as reference values of the state of charge of said battery for the construction or reconstruction by training of said non-linear regression models.

13. The method of claim 1, further comprising:
constructing the non-linear regression models of said set by training on the basis at least of a plurality of time series of measurements of voltage across the terminals of said battery and of at least one other time series of measurements of the second physical parameter of said battery or of its environment, and of corresponding reference values of the state of charge of said battery, wherein the constructing is implemented in non-real time by a regression training device not integrated into said energy-consuming device.

14. A device for estimating state of charge of a battery, the device and the battery being integrated into an energy-consuming device, the device comprising:
at least one voltage sensor configured to measure a voltage across terminals of said battery;
at least second sensor configured to measure a second physical parameter of said battery or of its environment, wherein the second physical parameter is chosen from among: a current provided or absorbed by the battery, an internal temperature of the battery, an ambient or internal temperature, a mean of values of said at least one time series of voltage measurements, a charging or discharging status of said battery, a charging or discharging rate, an impedance of the battery, and a measurement of a state of health of the battery;
a memory configured to store a set of non-linear regression models of the state of charge of said battery; and
a processor programmed to implement a method for estimating the state of charge of the battery comprising: acquiring at least one time series of measurements of voltage across the terminals of said battery and as at least one other time series of measurements of the second physical parameter of said battery or of its environment;
determining, as a function of said measurements, an operating regime of said battery;
choosing, as a function of said operating regime, a non-linear regression model from among a predefined set of such models; and
estimating the state of charge of said battery by applying said non-linear regression model to said time series of voltage measurements and to said or to at least one said other time series of measurements;
wherein said method is executed with said sensors and said memory.

15. A system for estimating the state of charge of a battery comprising the state of charge estimation device of claim 14, and a device for training regression models comprising:
a database configured to store a plurality of time series of measurements of voltage across the terminals of the battery and at least one second physical parameter of said battery or of its environment;
a processor programmed to construct a set of non-linear regression models by training on the basis at least of a plurality of time series of measurements of voltage across the terminals of the battery and of at least one other time series of measurements of a second physical parameter of said battery or of its environment, and of corresponding reference values of the state of charge of said battery; and
and a data transmission system linking said database and said processor.

* * * * *